United States Patent
Yang et al.

(10) Patent No.: US 6,180,532 B1
(45) Date of Patent: Jan. 30, 2001

(54) METHOD FOR FORMING A BORDERLESS CONTACT HOLE

(75) Inventors: Chan-Lon Yang, Taipei; Tong-Yu Chen, Hsinchu; Tsu-An Lin, Taichung, all of (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/213,129

(22) Filed: Dec. 15, 1998

(51) Int. Cl.$^7$ ................................................ H01L 21/3065
(52) U.S. Cl. .................... 438/710; 438/711; 438/723; 438/724; 438/743; 438/744
(58) Field of Search ................................ 438/706, 710, 438/711, 719, 723, 724, 743, 744, 714, 729

(56) References Cited

U.S. PATENT DOCUMENTS

| | | | |
|---|---|---|---|
| 5,595,627 | * 1/1997 | Inazawa et al. | 156/643.1 |
| 5,767,017 | * 6/1998 | Armacost et al. | 438/694 |
| 5,811,357 | * 9/1998 | Armacost et al. | 438/723 |
| 5,904,780 | * 5/1999 | Tomoyasu | 118/723 |

\* cited by examiner

*Primary Examiner*—Robert Kunemund
*Assistant Examiner*—Binh X Tran
(74) *Attorney, Agent, or Firm*—Hickman Coleman & Hughes, LLP

(57) ABSTRACT

A method for forming a contact hole in a silicon oxide layer formed over a silicon nitride layer and a substrate performs an etching process with an etchant, $C_4F_8/Ar$ or $C_4F_8/C_2F_6/Ar$, on an inductively coupled plasma etcher. The inductively coupled plasma etcher contains a chamber, a ring, and a roof. The etchant used in the etching process is controlled by conditions that include a $C_4F_8$ flow of about 10 to 20 sccm, a CO flow of less than about 100 sccm, and an Ar flow of about 50 to 500 sccm. In the meantime, the conditions of the inductively coupled plasma etcher include a roof temperature of about 150 to 300 ° C., a ring temperature of about 150 to 400 ° C., and a pressure within the chamber of about 4 to 50 mtorr. By performing a plasma etching process under the foregoing conditions, a properly profiled contact hole is obtained.

2 Claims, 5 Drawing Sheets

METHOD FOR FORMING A BORDERLESS CONTACT HOLE

BACKGROUND OF THE INVENTION

1. Field of the Invention

This invention relates to a semiconductor fabrication process, and more particularly, to a method for forming a borderless contact hole.

2. Description of Related Art

In order to achieve higher integration of a semiconductor device, a borderless contact process has been implemented in the most current semiconductor fabrication processes. Even though the borderless contact process is able to efficiently downsize a semiconductor device to increase the integration, problems, such as how to effectively control the etching process with a properly selected etching stop layer and etchant, still need to be resolved.

A currently used borderless contact process is schematically illustrated in FIGS. 1A through 1C.

Referring to FIG. 1A, a silicon nitride layer 14 is formed on a substrate 10 to cover preformed devices including an isolation structure 11, a gate 12 and source/drain regions 13 of a metal-oxide-semiconductor (MOS) transistor. The silicon nitride layer 14 serves as an etching end point, and provides protection to the isolation structure 11 in the follow-up etching process. A silicon oxide layer 15 is then formed on the silicon nitride layer 14.

Referring next to FIG. 1B, an etching process 17 is performed on the silicon oxide layer 15 to form an opening 16 that exposes a portion of the silicon nitride layer 14, which is the etching stop layer. Normally, the etching process 17 is performed on a magnetically enhanced reactive ion etching (MERIE) etcher along with gaseous $C_4F_8/CO/O_2/Ar$ as an etching gas. Then, by removing the exposed silicon nitride layer 14 within the opening 16, a contact hole 16a that exposes a portion of the source/drain regions 13 is finished, as shown in FIG. 1C.

Because the oxide-to-nitride selectivity is the most critical parameter for the foregoing etching process, the profile of the contact hole 16a directly relates to the oxide-to-nitride selectivity of the selected etchant. Once an etchant with an improper oxide-to-nitride is used in the foregoing process, a problem, either over-etching the silicon nitride layer 14 as shown in FIG. 2A, or an abnormal termination of the etching process as shown in FIG. 2B, further causes electrical malfunction. While an etching process is performed on the silicon oxide layer 15 to form an opening 17, the etching process is terminated as soon as the silicon nitride 14 is exposed. However, with an improperly selected etchant, a defective opening 17, as shown in either FIGS. 2A or 2B, is obtained. A tapered profile opening 19 as shown in FIG. 2C is also a possible defective opening caused by a improperly selected etchant.

As shown in FIG. 2D, because polymer molecules generated by the etchant normally tend to deposit on the silicon oxide near the corners of the opening 20 that further abnormally affects the isotropy of the performed etching process, a bowed profile opening 20 is obtained. Since in the fabrication process of a highly integrated semiconductor device, a vertical profile, which has lateral walls forming angles of nearly 90 degrees to the surface of the substrate, is required to meet the desired design rule, a bowed profile opening 20 is definitely unable to meet the requirement.

An etching process that uses an etchant with a low oxide-to-nitride selectivity normally leads to etch through the etch stop layer as shown in FIGS. 2A. On the other hand, an etchant with a high oxide-to-nitride selectivity tends to cause an under-etched opening, a tapered profile and/or a bowed profile opening shown in FIGS. 2B, 2C and 2D. Therefore, conventionally, a borderless contact process can only perform on either one of the options, a vertical profile or a better control of the etching end point with high oxide to nitride selectivity, accordingly to the actual needs.

SUMMARY OF THE INVENTION

It is therefore an objective of the present invention to provide a method for forming a borderless contact hole with a vertical profile.

It is another an objective of the present invention to provide a method for forming a vertical-profile borderless contact hole by using an etchant with a high oxide-to-nitride selectivity without causing etching through etch stop layer.

It is still another objective of the present invention to provide a method for forming a borderless contact hole to overcome the punching through the etch stop layer and under-etching problems, while also providing a better control of the contact hole profile.

In accordance with the foregoing and other objectives of the present invention, the method of the invention performs an etching process to form a borderless contact hole by using an inductively coupled plasma etcher along with the selected gaseous etchant, $C_4F_8/Ar$, $C_4F_8/CO/Ar$, $C_4F_8/C_2F_6/Ar$, or $C_4F_8/C_2F_6/CO/Ar$ under properly defined conditions.

On a provided substrate, a silicon nitride layer and a silicon oxide layer are formed in sequence by the method of the invention, wherein the silicon nitride layer serves as an etching stop layer. Then, the method of the invention forms a contact hole in the silicon oxide layer by performing an etching process with an etchant, $C_4F_8/Ar$, $C_4F_8/CO/Ar$, $C_4F_8/C_2F_6/Ar$, or $C_4F_8/C_2F_6/CO/Ar$ on an inductively coupled plasma etcher. The inductively coupled plasma etcher contains a chamber, a ring, and a roof. The etchant used in the etching process is controlled under conditions including a $C_4F_8$ flow of about 10 to 20 sccm, and an Ar flow of about 50 to 500 sccm. The flow of $C_2F_6$ is about 0.5 to 1.5 times of that of $C_4F_8$, if the selected etchant is $C_4F_8/C_2F_6/Ar$. The flow of CO is less than about 100 sccm. In the mean time, the conditions of the inductively coupled plasma etcher include a roof temperature of about 100 to 300° C., a ring temperature of about 150 to 400° C., and a pressure within the chamber of about 4 to 100 mtorr. By controlling the chamber pressure and the deposition rate of the polymer molecules, a properly profiled contact hole is obtained.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1A:
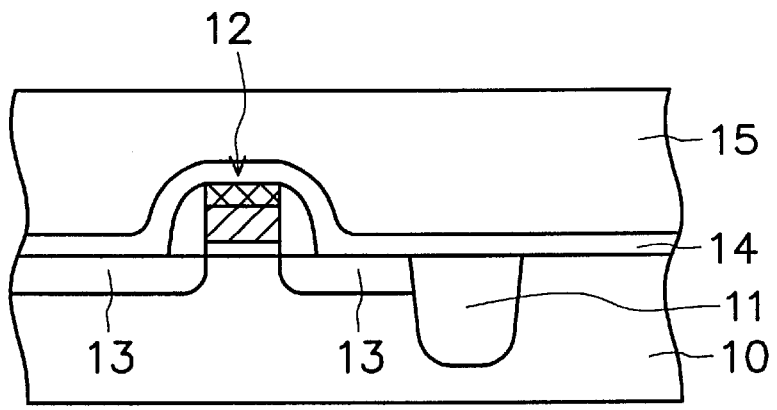
FIGS. 1A through 1C are schematic, cross-sectional views showing a conventional method for forming a borderless contact hole.
Figure 1B:
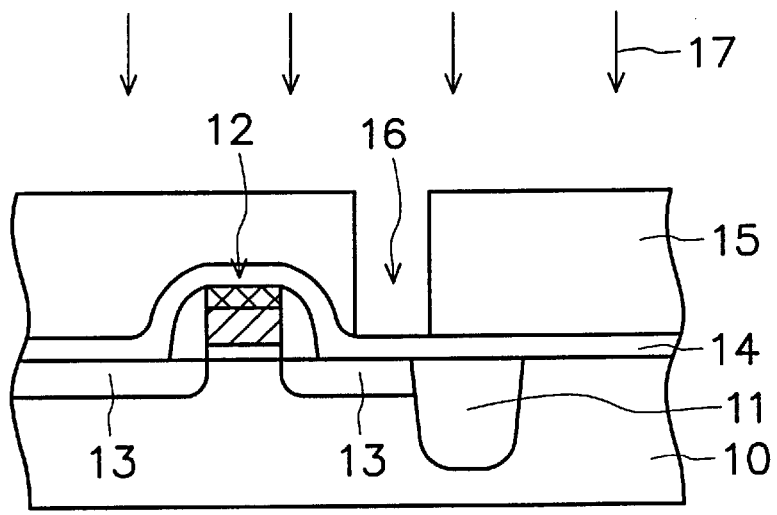
Figure 1C:
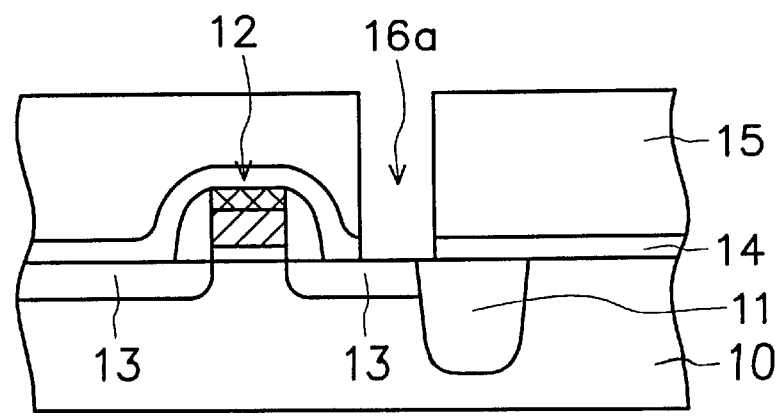
Figure 2A:
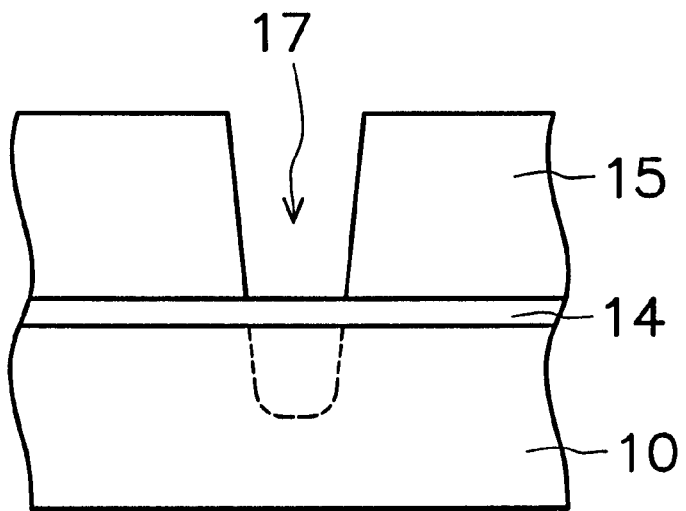
FIGS. 2A through 2D are schematic, cross-sectional views showing four different, defective contact holes formed by conventional methods.
Figure 2B:
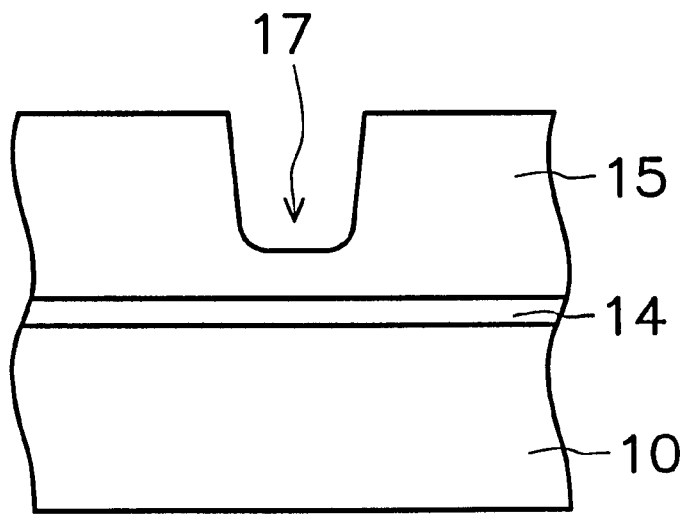
Figure 2C:
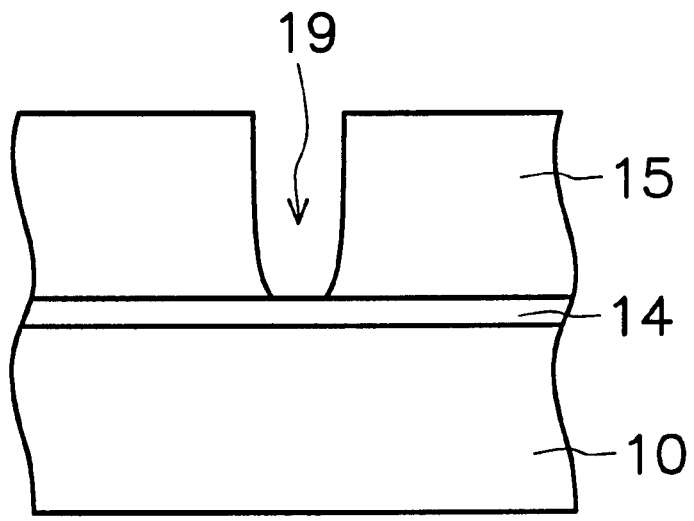
Figure 2D:
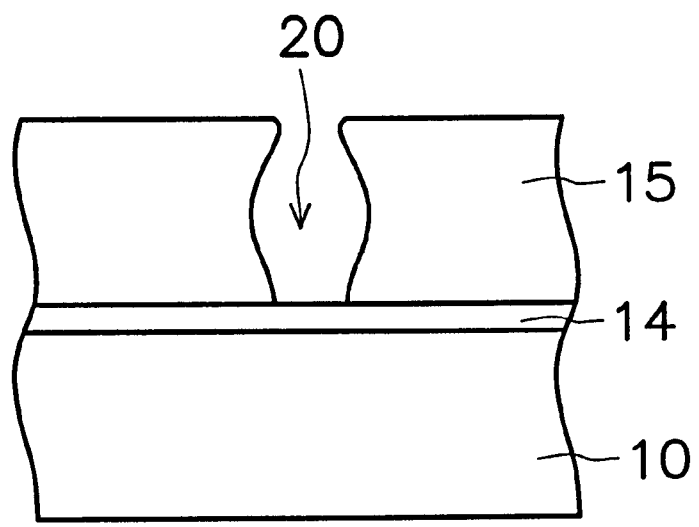
Figure 3A:
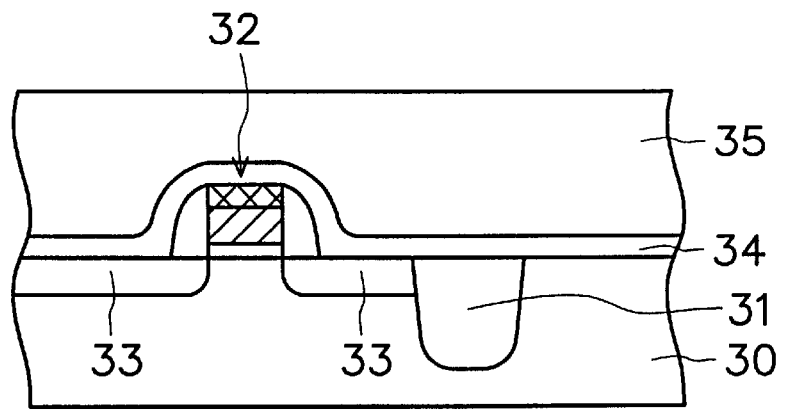
FIGS. 3A through 3C are schematic, cross-sectional views showing a method for forming a borderless contact hole in a preferred embodiment according to the invention.
Figure 3B:
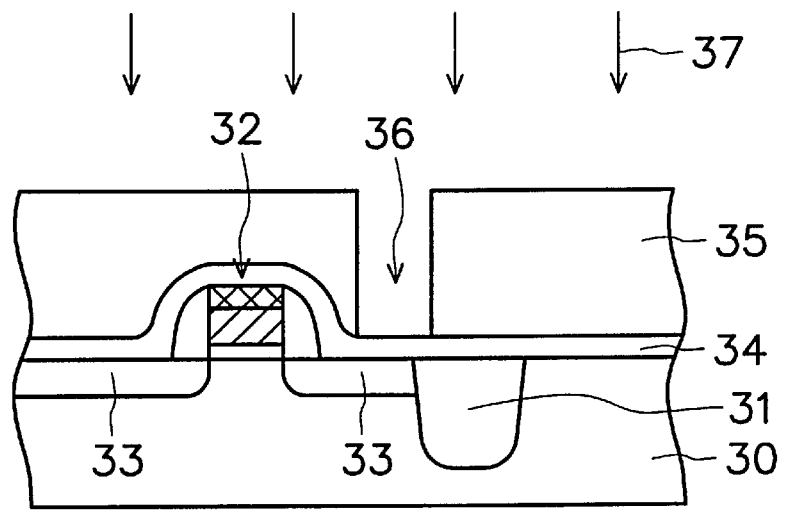
Figure 3C:
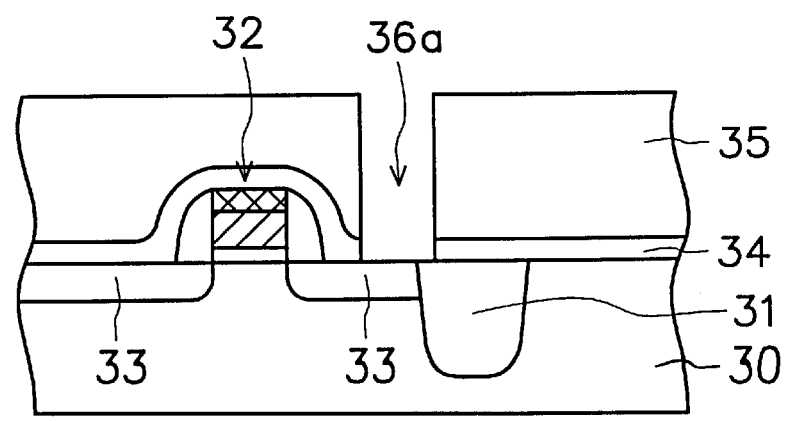

The invention provides a new method for forming a borderless contact hole as shown in FIGS. 3A through 3C.

Referring to FIG. 3A, a provided substrate 30 contains at least an isolation structure 31, normally oxide, and a device, such as a metal-oxide-semiconductor (MOS) transistor. The MOS transistor contains a gate 32 and at least one source/drain region 33. By performing a process, for example, a chemical vapor deposition process such as low-pressure chemical vapor deposition (LPCVD) or a plasma enhanced chemical vapor deposition (PECVD), a silicon nitride layer 34 is formed to cover the foregoing substrate 30, the isolation structure 31 and the MOS transistor. The silicon nitride layer 34 is used as an etching end point in the follow-up etching process. Then, a silicon oxide layer 35 formed by a process, for example, a CVD process such as LPCVD, atmosphere CVD (APCVD), or PECVD is deposited on the silicon nitride layer 34. The silicon oxide layer 35 isolates the MOS transistor from any subsequently formed devices.

Referring next to FIG. 3B, a patterned mask layer (not shown in figure) is formed on the silicon oxide layer by a conventional photolithography and etching process. Then, by applying a high-density-plasma, inductively coupled plasma etcher together with a selected etchant, such as gaseous $C_4F_8/Ar$, $C_4F_8/CO/Ar$, $C_4F_8/C_2F_6/Ar$, or $C_4F_8/C_2F_6/CO/Ar$, an etching process 37 is performed on the silicon oxide layer to form an opening 36. In the case that $C_4F_8/Ar$ is selected as the etchant, the flow of $C_4F_8$ is controlled at about 10 to 20 sccm (standard cubic centimeter per minute), and the flow of Ar is controlled at about 50 to 500 sccm. In the case that $C_4F_8/C_2F_6/Ar$ is selected as the etchant, the flow of $C_2F_6$ is about 0.5 to 1.5 times of that of $C_4F_8$. The flow rate of CO is controlled less than about 100 sccm. The gaseous $C_4F_8$ and $C_2F_6$ provide carbon and fluorine, wherein carbon increases the deposition rate of polymer molecules for keeping the oxide-to-nitride selectivity inside of the contact hole, the fluorine ion increases the etching rate, and keeping the vertical profile. Ar is used here to enhance the etching rate and reduce the etch stop.

Figure 4:
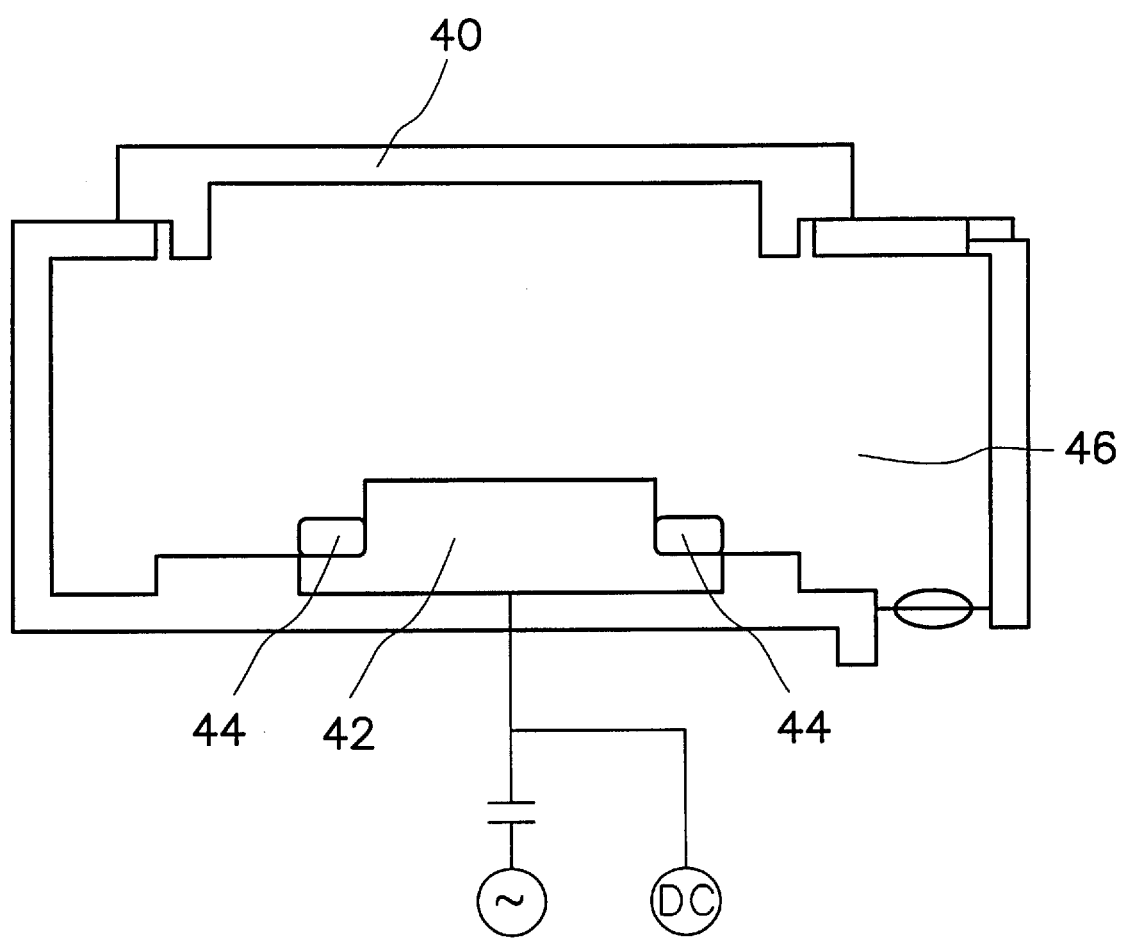
FIG. 4 is a schematic diagram showing the high plasma-density, inductively coupled plasma etcher used in the preferred embodiment of the invention.

As shown in FIG. 4, a high-density-plasma inductively coupled plasma etcher consists of a roof 40, a ring 44 and a chamber 46, wherein the ring 44 sits on a stage 42.

Because the etching rate of the etching process relates to the chamber pressure, lowering the chamber pressure accelerates the etching rate and vice versa, so that the etching rate can be controlled by varying the chamber pressure according to the desired aspect ratio of the opening. Temperature within the chamber 46, on the other hand, controls the deposition rate of the polymer molecules on the silicon oxide layer 35, wherein the polymer molecules suppress the etching process 37 to keep the profile of the opening 36. Increasing the temperature within the chamber 46 increases the number polymer molecules deposited on the silicon oxide layer 35. Furthermore, the fluorine ion tends to combining with $CF_x$ at a high temperature; therefore, increasing the temperature within the chamber 46 can further suppress the etching rate by reducing the number of fluorine ions. While the foregoing etching process is performed within the chamber 46, preferably the temperature of the roof 40 is controlled at about 150 to 300° C., and the temperature of the ring 44 is controlled at about 150 to 400° C. The pressure within the chamber 46 is controlled at about 4 to 50 mtorr.

In the case that a lower deposition rate of the polymer molecules is needed, it can also be achieved by using a lower flow of $C_4F_8$ and higher flows of $C_2F_6$ and Ar, wherein the flow of $C_4F_8$ is about 10 to 20 sccm, the flow of CO is less than about 100 sccm, and the flow of Ar is about 50 to 500 sccm. Under the foregoing conditions, an oxide-to-nitride selectivity of about 20:1 can be obtained. In the mean time, a vertical profile of nearly 90 degrees (>89 degrees) is achieved, as well.

Referring to FIG. 3C, after the opening 36, which exposes the silicon nitride layer 34 underneath the silicon oxide layer 35, is formed, the exposed portion of the silicon nitride layer 34 is also removed to form a contact hole 36a that exposes the source/drain region 33. A follow-up process, such as metallization, is performed to form a plug within the opening. This process is well known by people skilled in this art, and there is no further description of it.

The opening formed by the method of the invention in this preferred embodiment exposes a portion of a source/drain region, wherein the opening serves as a contact hole. The method of the invention can also be used to form an opening that exposes a portion of a conductive layer, wherein the opening serves as a via hole.

In accordance with the foregoing, the method of the invention has the following advantages:

1. The method of the invention is able to achieve both a high oxide-to-nitride selectivity and a vertical-profile opening by operating a high-density-plasma inductively coupled plasma etcher with a selected etchant, $C_4F_8/Ar$, $C_4F_8/CO/Ar$, $C_4F_8/C_2F_6/Ar$, and $C_4F_8/C_2F_6/Ar/CO$ under properly determined conditions; and 2. The method of the invention is able to keep the profile of the opening that directly relates to the etching rate of the etching process by controlling the chamber pressure and the deposition rate of polymer molecules.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for forming a contact hole, wherein the method is performed on an inductively coupled plasma etcher, and wherein the inductively coupled plasma etcher contains a roof, a ring and a chamber, the method comprising:

providing a substrate;

forming a silicon nitride layer on the substrate;

forming a silicon oxide layer on the silicon nitride layer;

patterning the silicon oxide layer by performing a plasma etching process with an etchant to form an opening therein, wherein the opening exposes a portion of the silicon nitride layer, the silicon nitride layer serves as an etching stop layer, the etchant used in the plasma process is selected from the group consisting of gaseous $C_4F_8/Ar$, $C_4F_8/Ar/CO$, $C_4F_8/C_2F_6/Ar$ and $C_4F_8/C_2F_6/Ar/CO$, and a $C_4F_8$ flow is controlled at about 10 to 20 sccm, a flow of Ar is controlled at about 50 to 500 sccm, a temperature of the roof is controlled at about 150 to 300° C., a temperature of the ring is controlled at about 150 to 400° C., a CO flow is controlled under about 100 sccm, and pressure within the chamber is controlled at about 4 to 50 mtorr; and removing a portion of the silicon nitride layer exposed by the opening to form the contact hole with a vertical profile of nearly 90 degrees.

2. A method for forming a contact hole to expose a portion of a substrate in a silicon oxide layer by performing an etching process on an inductively coupled plasma etcher, wherein the inductively coupled plasma etcher contains a roof, a ring and a chamber, the method comprising;

forming a silicon nitride layer on the substrate, wherein the silicon nitride layer serves as an etching stop layer;

forming a silicon oxide layer on the silicon nitride layer;

performing a plasma etching process in the chamber to form an opening with a vertical profile of nearly 90 degrees in the silicon oxide layer to expose a portion of the silicon nitride layer underneath by using an etchant, wherein the etchant is one selected from the group consisting of gaseous $C_4F_8$/Ar, $C_4F_8$/Ar/CO, $C_4F_8$/$C_2F_6$/Ar and $C_4F_8$/$C_2F_6$/Ar/CO, and wherein the etchant works under the conditions of:

a flow of $C_4F_8$ controlled at about 10 to 20 sccm;

a flow of Ar controlled at about 50 to 500 sccm;

a flow of CO controlled less than about 100 sccm;

a temperature of the roof controlled at about 150 to 300° C.;

a temperature of the ring controlled at about 150 to 400° C.; and a pressure within the chamber is controlled at about 4 to 50 mtorr; and removing the exposed portion of the silicon nitride layer to expose a portion of the substrate underneath the exposed portion of the silicon nitride layer.

* * * * *